(12) United States Patent
Song et al.

(10) Patent No.: US 12,322,323 B2
(45) Date of Patent: Jun. 3, 2025

(54) DISPLAY DEVICE

(71) Applicant: KUNSHAN GO-VISIONOX OPTO-ELECTRONICS CO., LTD, Kunshan (CN)

(72) Inventors: Yanqin Song, Kunshan (CN); Junhui Lou, Kunshan (CN); Chuanzhi Xu, Kunshan (CN); Lu Zhang, Kunshan (CN); Siming Hu, Kunshan (CN)

(73) Assignee: KUNSHAN GO-VISIONOX OPTO-ELECTRONICS CO., LTD, Kunshan (JP)

( * ) Notice: Subject to any disclaimer, the term of this patent is extended or adjusted under 35 U.S.C. 154(b) by 0 days.

(21) Appl. No.: 18/240,710

(22) Filed: Aug. 31, 2023

(65) Prior Publication Data

US 2023/0410728 A1    Dec. 21, 2023

Related U.S. Application Data

(63) Continuation of application No. PCT/CN2022/089208, filed on Apr. 26, 2022.

(30) Foreign Application Priority Data

Aug. 31, 2021    (CN) .......................... 202111013161.0

(51) Int. Cl.
*G09G 3/32*    (2016.01)

(52) U.S. Cl.
CPC ....... *G09G 3/32* (2013.01); *G09G 2300/0842* (2013.01); *G09G 2320/0233* (2013.01); *G09G 2360/14* (2013.01)

(58) Field of Classification Search
CPC ................... G09G 3/32; G09G 3/3225; G09G 2300/0842; G09G 2320/0233;
(Continued)

(56) References Cited

U.S. PATENT DOCUMENTS

2014/0139470 A1    5/2014    Li et al.
2015/0243918 A1*   8/2015    Sasaki ................. H10K 50/121
                                                                257/40
(Continued)

FOREIGN PATENT DOCUMENTS

CN    109192076 A    1/2019
CN    111162199 A    5/2020
(Continued)

OTHER PUBLICATIONS

Office Action issued on Aug. 1, 2023, in corresponding Chinese Application No. 202111013161.0, 12 pages.
(Continued)

*Primary Examiner* — Brent D Castiaux
(74) *Attorney, Agent, or Firm* — Maier & Maier, PLLC

(57) ABSTRACT

A display device includes a structured light-emitting end, a structured light-receiving end, and a display panel. The structured light-emitting end and the structured light-receiving end are disposed on the backlight surface of the display panel. The structured light-receiving end is disposed opposite to the first display area, and the structured light-emitting end is disposed opposite to the second display area. The first display area of the display device is provided with multiple first pixel driving circuits and multiple first light-emitting units. The vertical projection of each first pixel driving circuit on the backlight surface of the display panel overlaps the vertical projection of one first light-emitting unit, which is connected to the each first pixel driving circuit, on the backlight surface of the display panel.

20 Claims, 5 Drawing Sheets

(58) Field of Classification Search
CPC ............. G09G 2360/14; H10K 59/131; H10K 59/126; H10K 59/65; H10K 59/121; H10K 59/60; H10K 59/12; H10K 59/1213
See application file for complete search history.

(56) References Cited

U.S. PATENT DOCUMENTS

| | | | | |
|---|---|---|---|---|
| 2015/0371579 | A1* | 12/2015 | Yu | G09G 3/3208 345/690 |
| 2016/0307510 | A1* | 10/2016 | Duan | G09G 3/3258 |
| 2020/0373372 | A1 | 11/2020 | Chung et al. | |
| 2021/0233976 | A1* | 7/2021 | Lee | H10K 77/10 |
| 2022/0155829 | A1* | 5/2022 | Lou | H04N 13/204 |

FOREIGN PATENT DOCUMENTS

| | | | | |
|---|---|---|---|---|
| CN | 210515985 | U | 5/2020 | |
| CN | 111292617 | A * | 6/2020 | ........... G06F 1/1686 |
| CN | 112017549 | A | 12/2020 | |
| CN | 112151592 | A | 12/2020 | |
| CN | 112271203 | A | 1/2021 | |
| CN | 112951886 | A | 6/2021 | |
| CN | 113097270 | A | 7/2021 | |
| CN | 113488600 | A | 10/2021 | |
| CN | 113690223 | A | 11/2021 | |
| CN | 113764488 | A | 12/2021 | |

OTHER PUBLICATIONS

International Search Report Issued on Jul. 6, 2022 in corresponding International Application No. PCT/CN2022/089208, 6 pages.
Office Action issued on Jul. 2, 2024, in corresponding Japanese Application No. 2023-550155, 18 pages.
Decision to Grant a Patent issued on Sep. 10, 2024, in corresponding Japanese Application No. 2023-550155, 5 pages.

* cited by examiner

DISPLAY DEVICE

CROSS-REFERENCE TO RELATED APPLICATION

This is a continuation of International Patent Application NO. PCT/CN2022/089208, filed on Apr. 26, 2022, which claims priority to Chinese Patent Application No. 202111013161.0 filed with the China National Intellectual Property Administration (CNIPA) on Aug. 31, 2021, the disclosure of which is incorporated herein by reference in its entirety.

TECHNICAL FIELD

The present disclosure relates to the field of display technology, for example, a display device.

BACKGROUND

The development of display panels is moving towards the direction of full-screen display. In a display panel 10, a transparent area with a high transmittance is required to accommodate structures such as a camera, a structured light-emitting end, and a structured light-receiving end so that a display device including the display panel can achieve 3D imaging at the time of shooting.

However, when the transparent area is used for display so that full-screen display of the display panel can be achieved, the requirements of the structured light-emitting end and the structured light-receiving end for structured light conflicts with the display effect of the display panel. The display effect of the display panel becomes poor if the requirements of the structured light-emitting end and structured light receiver for structured light are met.

SUMMARY

The present disclosure provides a display device, improving the display effect of a display panel on the basis of ensuring that the display device can achieve 3D imaging at the time of shooting and that the display panel can achieve full-screen display.

An embodiment of the present disclosure provides a display device. The display device includes a structured light-emitting end, a structured light-receiving end, and a display panel.

The structured light-emitting end is disposed on a backlight surface of the display panel.

The structured light-receiving end is disposed on the backlight surface of the display panel.

The display panel comprises a first display area, a second display area, and a third display area. The third display area at least partially surrounds the first display area and the second display area. A transmittance of the first display area and a transmittance of the second display area are greater than a transmittance of the third display area. The structured light-receiving end is disposed opposite to the first display area. The structured light-emitting end is disposed opposite to the second display area.

The first display area is provided with a plurality of first pixel driving circuits and a plurality of first light-emitting units, each of the plurality of first pixel driving circuits are connected to at least one of the plurality of first light-emitting units, and a vertical projection of each of the plurality of first pixel driving circuits on the backlight surface of the display panel overlaps a vertical projection of one of the plurality of first light-emitting units on the backlight surface of the display panel, the one of the plurality of first light-emitting units being connected to the each of the plurality of first pixel driving circuits.

The second display area is provided with a plurality of second pixel driving circuits and a plurality of second light-emitting units, each of the plurality of second pixel driving circuits are connected to at least one of the plurality of second light-emitting units, and a light intensity of structured light emitted from the structured light-emitting end to each of the plurality of second pixel driving circuits is less than a light intensity of the structured light emitted into the second display area.

According to the technical solution of the embodiments of the present disclosure, the first pixel driving circuits in the first display area are disposed on one side of the first light-emitting units facing away from the emitting surface of the display panel, achieving the built-in of the first pixel driving circuits, thereby forming a large transparent area in the first display area. The first display area is disposed opposite to the structured light-receiving end so that the requirement of the structured light-receiving end for a large transparent area can be better met, allowing the structured light-receiving end to receive more amount of light and ensuring the accuracy of determining depth information of an object by the structured light-receiving end. The light intensity of the structured light emitted from the structured light-emitting end to the second pixel driving circuits is provided to be less than the light intensity of the structured light emitted into the second display area so that the amount of the structured light emitted from the structured light-emitting end to the second pixel driving circuits can be reduced, thereby reducing the influence of the structured light on an active layer of transistors in the second pixel driving circuits, reducing the influence of the structured light on characteristics of the transistors in the second pixel driving circuits, and reducing the difference between the characteristics of the transistors in the second pixel driving circuits and the characteristics of transistors in pixel driving circuits in other display areas. Thus, the consistency of characteristics of transistors in pixel driving circuits of different display areas in the display panel 10 is improved, the display uniformity of the display panel 10 is improved, and the display effect of the display panel 10 is improved.

DETAILED DESCRIPTION

Figure 1:
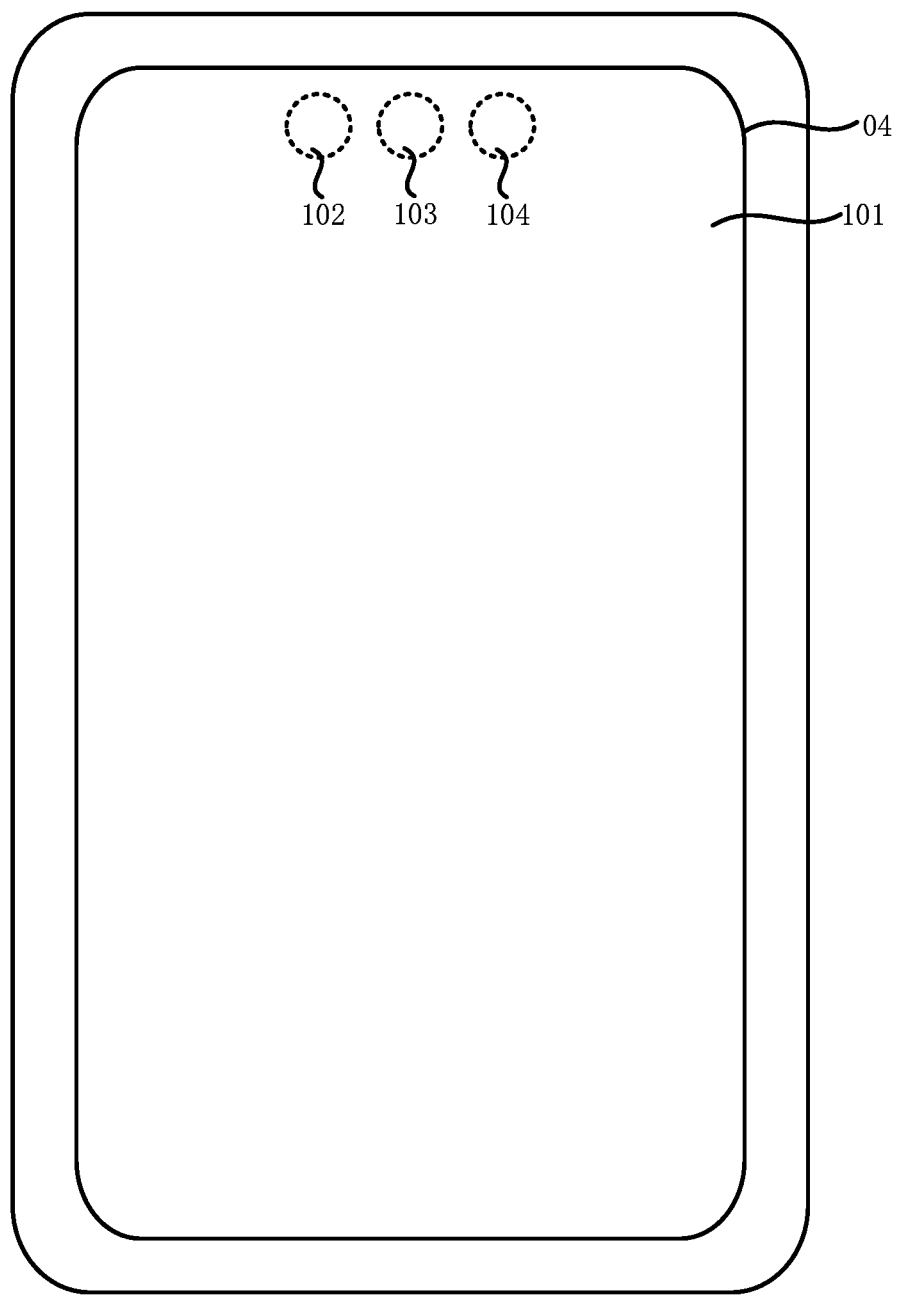
FIG. 1 is a top view of the structure of a display device.
Figure 2:
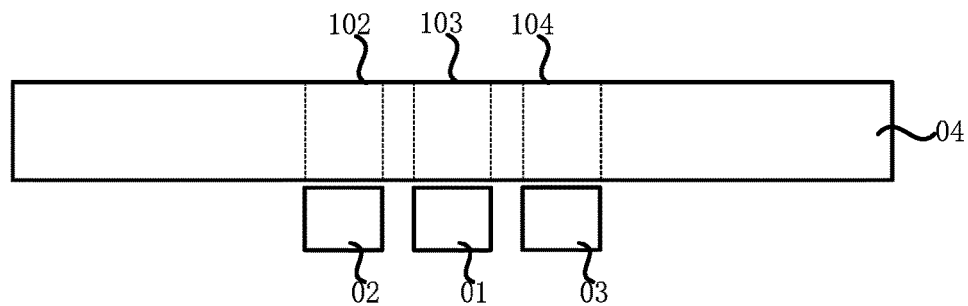
FIG. 2 is a sectional view of the structure of a display device.

Hereinafter the present disclosure is described in conjunction with drawings and embodiments. It is to be understood that the embodiments set forth below are intended to illustrate and not to limit the present disclosure. Additionally, it is to be noted that for ease of description, only part, not all, of structures related to the present disclosure are illustrated in the drawings. As shown in FIGS. 1 and 2, a display device includes a photosensor 01, a structured light-emitting end 02, a structured light-receiving end 03, and a display panel 04. The photosensor 01, the structured light-emitting end 02, and the structured light-receiving end 03 are disposed on the backlight side of the display panel 04. The display panel 04 includes a first area 101, a second area 102, a third area 103, and a fourth area 104. The first area 101 at least partially surrounds the second area 102, the third area 103, and the fourth area 104.

For example, as shown in FIG. 1, the first area 101 is disposed to entirely surround the second area 102, the third area 103, and the fourth area 104, and the second area 102, the third area 103, and the fourth area 104 are spaced apart from each other. The structured light-emitting end 02 is disposed opposite to the second area 102, the photosensor 01 (for example, the photosensor 01 may be a camera) is disposed opposite to the third area 103, and the structured light-receiving end 03 is disposed opposite to the fourth area 104. The structured light-emitting end 02 may be used to emit infrared light, and the structured light-receiving end 03 may be used to receive the infrared light so that Z-axis information is collected at the time of shooting to determine depth information of an object. The photosensor 01 is used for capturing planar XY-axis information of an object. 3D imaging at the time of shooting is achieved by the photosensor 01, the structured light-emitting end 02, and the structured light-receiving end 03. When the second area 102, the third area 103, and the fourth area 104 are used for display, pixel units are provided in the second area 102, the third area 103, and the fourth area 104 so that full-screen display of the display panel 04 is achieved. At this time, the structured light emitted from the structured light-emitting end 02 illuminates the pixel units in the second area 102, and in a transistor in a pixel unit in the second area 102, an active layer is disposed on a side of a metal layer facing the structured light-emitting end 02 so that the structured light directly illuminates the active layer, thereby affecting characteristics of the transistor in the pixel unit in the second area 102, resulting in the difference between the brightness of pixel units in the second area 102 and the brightness of pixel units in other areas, thereby reducing the display uniformity of the display panel. At the same time, the pixel units in the fourth area 104 may reduce the transmittance of the fourth area 104 so that the amount of the structured light received by the structured light-receiving end 03 is reduced, thereby reducing the accuracy of 3D imaging of the display device at the time of shooting.

Figure 3:
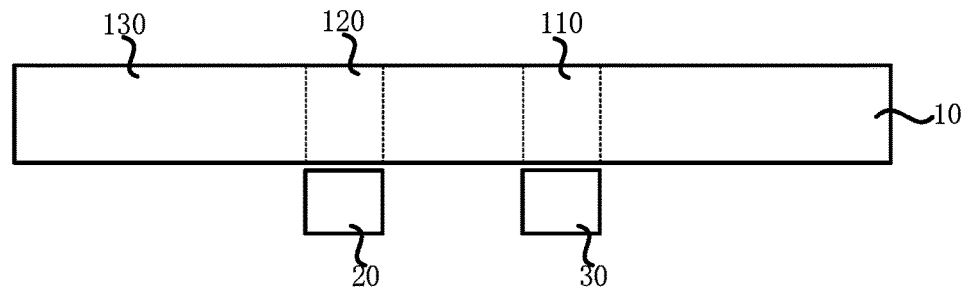
FIG. 3 is a sectional view of the structure of a display device according to an embodiment of the present disclosure.

This embodiment of the present disclosure provides a display device. As shown in FIG. 3, the display device includes a structured light-emitting end 20, a structured light-receiving end 30, and a display panel 10. The structured light-emitting end 20 and the structured light-receiving end 30 is disposed on the backlight surface of the display panel 10. The display panel 10 includes a first display area 110, a second display area 120, and a third display area 130. The third display area 130 at least partially surrounds the first display area 110 and the second display area 120. The transmittance of the first display area 110 and the transmittance of the second display area 120 are greater than the transmittance of the third display area 130. The structured light-emitting end 30 is disposed opposite to the first display area 110, and the structured light-emitting end 20 is disposed opposite to the second display area 120. The first display area is provided with multiple first pixel driving circuits and multiple first light-emitting units. Each first pixel driving circuit is connected to at least one first light-emitting unit. The vertical projection of each first pixel driving circuit on the backlight surface of the display panel 10 overlaps the vertical projection of one first light-emitting unit, which is connected to the each first pixel driving circuit, on the backlight surface of the display panel 10. The second display area 120 is provided with multiple second pixel driving circuits and multiple second light-emitting units. Each second pixel driving circuit is connected to at least one second light-emitting unit. The light intensity of the structured light emitted from the structured light-emitting end 20 to each second pixel driving circuit is less than the light intensity of the structured light emitted into the second display area 120.

The structured light-emitting end 20 is configured to emit structured light, and the structured light-receiving end 30 is configured to receive structured light. For example, the structured light-emitting end 20 can emit infrared light, and the structured light-receiving end 30 can receive infrared light. With the structured light-emitting end 20 and structured light-receiving end 30, the display device can acquire the depth information of an object at the time of shooting, achieving 3D imaging of the display device. The display panel 10 may be a full-screen display panel 10. The third display area 130 may be a conventional display area of the display panel 10, also referred to as a main screen of the display panel 10.

For example, the third display area 130 may include third pixel driving circuits and third light-emitting units. The third pixel driving circuits are connected to the third light-emitting units. The third pixel driving circuit is configured to provide a driving signal for the third light-emitting unit to drive the third light-emitting unit to emit light. The first display area 110 and the second display area 120 may be transparent display areas of the display panel 10, also referred to as secondary screens of the display panel 10. The transmittances of the transparent display areas are greater than the transmittance of the third display area 130 so that the required transmittances for the emission and reception of the structured light are ensured. The first display area 110 is provided with multiple first pixel driving circuits and multiple first light-emitting units. The vertical projection of each first pixel driving circuit on the backlight surface of the display panel 10 is provided to overlap the vertical projection of one first light-emitting unit, which is connected to the each first pixel driving circuit, on the backlight surface of the display panel 10, that is, along the thickness direction of the display panel 10, each first pixel driving circuit and one first light-emitting unit are stacked in the first display area 110. This eliminates the need to separately place the first pixel driving circuits outside the first display area 110, achieving the built-in of the first pixel driving circuits. When the transmittance of the first display area 110 is greater than the transmittance of the third display area 130, the first display area 110 may be used to receive structured light, and a large transparent display area is easily formed within the first display area 110, which better meets the requirement of the structured light-receiving end 30 for a large transparent area. Thus, the structured light-receiving end 30 can receive a larger amount of light, ensuring the accuracy of determining the depth information of an object by the structured light-receiving end 30. The transmittance of the second display area 120 is greater than the transmittance of the third display area 130 so that the transmittance required by the structured light-emitting end 20 can be ensured. In this manner, the amount of light required by the structured light-emitting end 20 can be ensured, thereby ensuring the accuracy of determining the depth information of an object by the structured light-emitting end 20.

The second display area 120 is provided with multiple second pixel driving circuits and multiple second light-emitting units. Each second pixel driving circuit is connected to at least one second light-emitting unit so that the each second pixel driving circuit provides a driving signal for the at least one second light-emitting unit connected to the each second pixel driving circuit to drive the at one second light-emitting unit to emit light. The light intensity of the structured light emitted from the structured light-emitting end 20 into the second display area 120 may be the light intensity of the structured light emitted from the structured light-emitting end 20 to a substrate of the display panel 10. The substrate of the display panel 10 may include a support layer, a base, a buffer layer and the like. The light intensity of the structured light emitted from the structured light-emitting end 20 to the second pixel driving circuits is provided to be less than the light intensity of the structured light emitted into the second display area 120 so that the amount of the structured light emitted from the structured light-emitting end 20 to the second pixel driving circuits can be reduced, thereby reducing the influence of the structured light on an active layer of the transistors in the second pixel driving circuits, reducing the influence of the structured light on characteristics of the transistors in the second pixel driving circuits, and reducing the difference between the characteristics of the transistors in the second pixel driving circuits and the characteristics of transistors in pixel driving circuits in other display areas. Thus, the consistency of characteristics of transistors in pixel driving circuits in different display areas in the display panel 10 is improved, the display uniformity of the display panel 10 is improved, and the display effect of the display panel 10 is improved.

Figure 4:
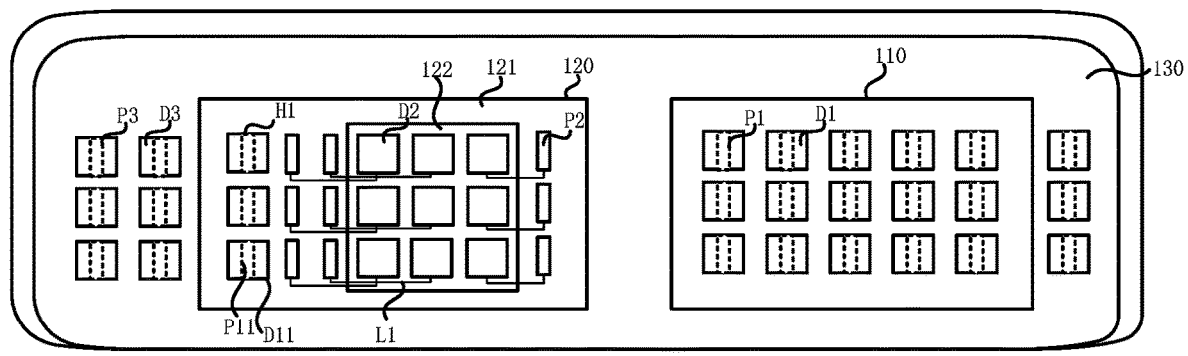
FIG. 4 is a partial top view of the structure of a display device according to an embodiment of the present disclosure.

As shown in FIGS. 3 and 4, the second display area 120 includes a first transition area 121 and a first transparent display area 122. The first transition area 121 at least partially surrounds the first transparent display area 122. Multiple second pixel driving circuits P2 are disposed in the first transition area 121, and multiple second light-emitting units D2 are disposed in the first transparent display area 122. The structured light-emitting end 20 is disposed opposite to the first transparent display area 122.

The third display area 130 may include third pixel driving circuits P3 and third light-emitting units D3. A third pixel driving circuit P3 is connected to a third light-emitting unit D3. The third pixel driving circuit P3 is configured to provide a driving signal for the third light-emitting unit D3 to drive the third light-emitting unit D3 to emit light. The first display area 110 is provided with multiple first pixel driving circuits P1 and multiple second light-emitting units D1. Each first pixel driving circuit P1 is connected to at least one first light-emitting unit D1 so that the each first pixel driving circuit P1 provides a driving signal for the at least one first light-emitting unit D1 connected to the each first pixel driving circuit P1 to drive the at least one first light-emitting unit D1 to emit light. The first transition area 121 in the second display area 120 is provided with multiple second pixel driving circuits P2. The first transparent display area 122 is provided with multiple second light-emitting units D2. Each second pixel driving circuit P2 is connected to at least one second light-emitting unit D2 so that the each second pixel driving circuit P2 provides a driving signal for the at least one second light-emitting unit D2 connected to the each second pixel driving circuit P2 to drive the at one second light-emitting unit D2 to emit light. The structured light-emitting end 20 is disposed opposite to the first transparent display area 122. Only the second light-emitting units D2 are disposed in the first transparent display area 122 to achieve bypass placement of the second pixel driving circuits P2. In this manner, the case where the second pixel driving circuits P2 are disposed in the first transparent display area 122 can be avoided, thereby reducing the influence of metal structures in the second pixel driving circuits P2 on the transmittance of the first transparent display area 122 and ensuring the transmittance of the first transparent display area 122. Thus, the amount of light required by the structured light-emitting end 20 is ensured, and the accuracy of determining the depth information of an object by the structured light-emitting end 20 is ensured. At the same time, most of the structured light emitted from the structured light-emitting end 20 is emitted out of the first transparent display area 122, reducing the light intensity of the structured light illuminating the second pixel driving circuits P2, and reducing the influence of the structured light on characteristics of transistors in the second pixel driving circuit P2, and then reducing the difference between the characteristics of the transistors in the second pixel driving circuit and the characteristics of transistors in pixel driving circuits in other display areas. Thus, the consistency of characteristics of transistors in pixel driving circuits of different display areas in the display panel is improved, and the display uniformity of the display panel is improved.

For example, when the structured light-emitting end 20 emits infrared light, it can be avoided that the infrared light affects the characteristics of the transistors in the second pixel driving circuits P2. Thus, the consistency of characteristics of transistors in pixel driving circuits of different display areas in the display panel is improved, and the display uniformity of the display panel is improved.

As shown in FIG. 4, the first transition area 121 may also be provided with pixel units H1. A pixel units H1 include a pixel driving circuit P11 and a light-emitting unit D11. The pixel driving circuit P11 is connected to the light-emitting unit D11. The pixel driving circuit P11 is configured to provide a driving signal for the light-emitting unit D11 to drive the light-emitting unit D11 to emit light, achieving the display of the first transition area 121.

Figure 5:
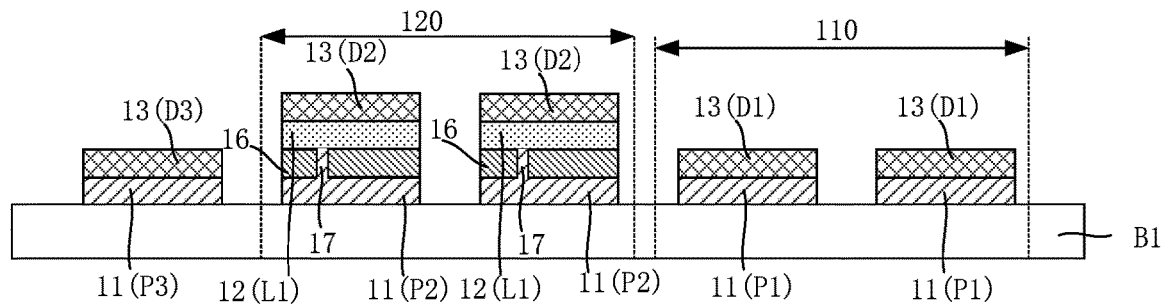
FIG. 5 is a partial sectional view of the structure of a display panel according to an embodiment of the present disclosure.

As shown in FIGS. 4 and 5, the display panel 10 further includes a pixel driving circuit layer 11, a first transparent conductive layer 12, and a light-emitting unit layer 13, which are stacked. Along the thickness direction of the display panel 10, the pixel driving circuit layer 11 is disposed on a side of the light-emitting unit layer 13 facing the backlight surface of the display panel 10. Multiple first pixel driving circuits P1 and multiple second pixel driving circuits P2 are disposed in the pixel driving circuit layer 11. Multiple first light-emitting units D1 and multiple second light-emitting units D2 are disposed in the light-emitting unit layer 13. The first transparent conductive layer 12 includes multiple first transparent conductive lines L1. Each second pixel driving circuit P2 is connected to one second light-emitting unit D2 through one first transparent conductive line L1.

The display panel 10 also includes a substrate B1. The pixel driving circuit layer 11 is disposed on the substrate B1. The pixel driving circuit layer 11 includes multiple conductive layers and an insulating layer to form devices in the pixel driving circuit such as a transistor and a capacitor. The light-emitting unit layer 13 may include an anode layer, a light-emitting layer, and a cathode layer which are stacked to form multiple light-emitting units. The anode layer is disposed on a side of the light-emitting layer facing the pixel driving circuit layer 11. The first transparent conductive layer 12 has a relatively high transmittance. For example, a material of the first transparent conductive layer 12 may be indium tin oxide. A first transparent conductive line L1 is formed in the first transparent conductive layer 12 to connect a second pixel driving circuit P2 to a second light-emitting unit D2, ensuring normal emission of the second light-emitting unit D2 and minimizing the impact of the first transparent conductive line L1 on the transmittance of the first transparent display area 122. As shown in FIG. 5, the first transparent conductive layer 12 is disposed between the pixel driving circuit layer 11 and the light-emitting unit layer 13. An insulating layer 16 is disposed between the first transparent conductive layer 12 and the pixel driving circuit layer 11, and is provided with a through hole 17. The first transparent conductive layer 12 is connected to the second pixel driving circuit P2 in the pixel driving circuit layer 11 via the through hole 17.

The third pixel driving circuit P3 is disposed in the pixel driving circuit layer 11, and the first pixel driving circuit P1, the second pixel driving circuit P2, and the third pixel driving circuit P3 are disposed on the same layer. The third light-emitting unit D3 is disposed in the light-emitting unit layer 13, and the first light-emitting unit D1, the second light-emitting unit D2, and the third light-emitting unit D3 are disposed on the same layer.

Figure 6:
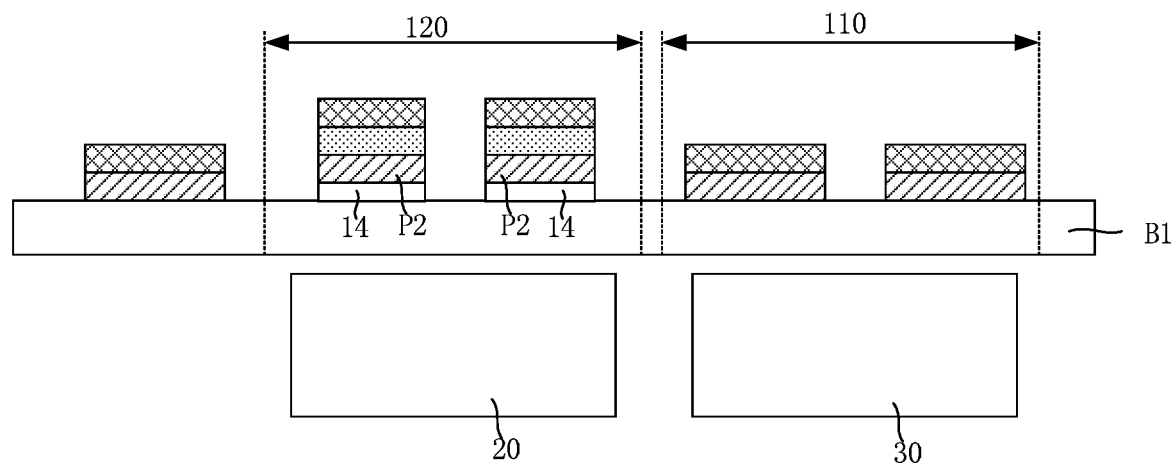
FIG. 6 is a partial sectional view of the structure of another display device according to an embodiment of the present disclosure.
Figure 7:
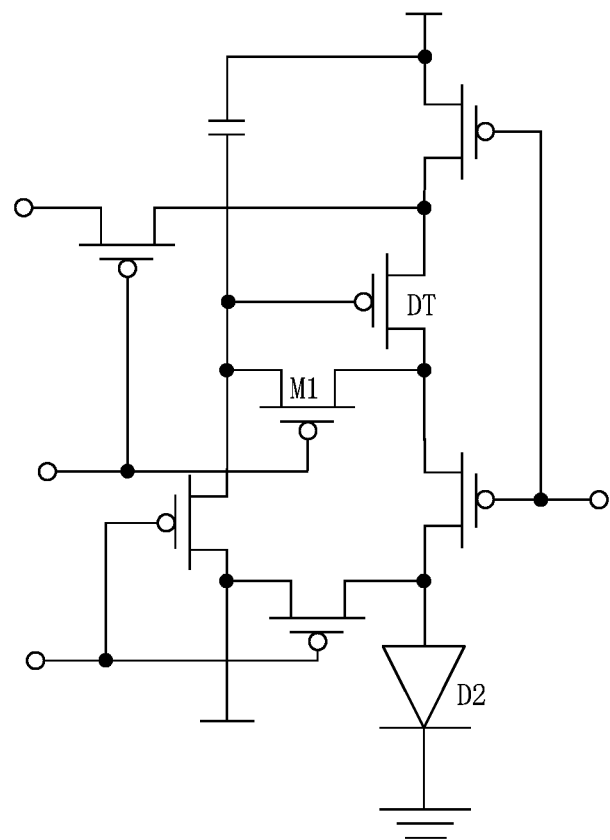
FIG. 7 is a structural diagram of a second pixel driving circuit according to an embodiment of the present disclosure.

As shown in FIGS. 6 to 7, the display panel 10 includes a reflective layer 14. Along the thickness direction of the display panel 10, the reflective layer 14 is disposed between the structured light-emitting end 20 and each second pixel driving circuit P2. Each second pixel driving circuit P2 includes a driving transistor DT and a threshold compensation transistor M1. The vertical projection of the reflective layer 14 on the backlight surface of the display panel 10 covers the vertical projections of the driving transistor DT and the threshold compensation transistor M1 on the backlight surface of the display panel 10.

When the display panel 10 is provided with the reflective layer 14, the reflective layer 14 may be disposed between the substrate B1 and the second pixel driving circuits P2. The second pixel driving circuits P2 are disposed in the second display area 120 correspondingly. The reflective layer 14 is used to block the structured light emitted from the structured light-emitting end 20, avoiding the structured light from illuminating the second pixel driving circuits P2 and reducing the influence of the structured light on characteristics of transistors in the second pixel driving circuits P2, thereby reducing the difference between the characteristics of the transistors in the second pixel driving circuits P2 and the characteristics of transistors in pixel driving circuits in other display areas. Thus, the consistency of characteristics of transistors in pixel driving circuits of different display areas in the display panel is improved, and the display uniformity of the display panel is improved.

For example, the second pixel driving circuit P2 may include a 7T1C. When the second pixel driving circuit P2 generates a driving current to drive the second light-emitting unit D2 to emit light, the characteristics of the driving transistor DT and the threshold compensation transistor M1 directly affect the driving current, thereby influencing the brightness of the second light-emitting unit D2. The vertical projection of the reflective layer 14 on the backlight surface of the display panel 10 is provided to cover the vertical projections of the driving transistor DT and the threshold compensation transistor M1 on the backlight surface of the display panel 10, so that along a direction directed from the structured light-emitting end 20 to the second pixel driving circuit P2, the reflective layer 14 covers the driving transistor DT and the threshold compensation transistor M1, which reduces the light intensity of the structured light emitted from the structured light-emitting end 20 to the driving transistor DT and the threshold compensation transistor M1, thereby reducing the influence of the structured light on the driving transistor DT and the threshold compensation transistor M1 and reducing the difference between the characteristics of the transistors in the second pixel driving circuits P2 and the characteristics of transistors in pixel driving circuits in other display areas. Thus, the consistency of characteristics of transistors in pixel driving circuits of different display areas in the display panel is improved, and the display uniformity of the display panel is improved.

For example, the reflective layer 14 may be a metal layer. Optionally, along the direction directed from the structured light-emitting end 20 to the second pixel driving circuit P2, the reflective layer 14 completely covers the driving transistor DT and the threshold compensation transistor M1, and the area of the reflective layer 14 is greater than the area of the driving transistor DT and the threshold compensation transistor M1, which further reduces the influence of the structured light transmitted along a non-vertical direction on the characteristics of the driving transistor DT and the threshold compensation transistor M1.

With continued reference to FIGS. 6 and 7, each second pixel driving circuit P2 also includes a switch transistor and a storage capacitor. The vertical projection of the reflective layer 14 on the backlight surface of the display panel 10 covers the vertical projection of the switch transistor and the storage capacitor on the backlight surface of the display panel 10.

The switch transistor includes all transistors in the second pixel driving circuit P2 except the driving transistor DT and the threshold compensation transistor M1. When the reflective layer 14 covers the switch transistor and the storage capacitor at the same time, the reflective layer 14 completely covers the second pixel driving circuit P2. This reduces the influence of the structured light on the characteristics of the switch transistor and further reduces the influence of the structured light on the characteristics of the transistors in the second pixel driving circuit P2.

With continued reference to FIGS. 6 and 7, the ratio of the vertical projection area of the multiple second pixel driving circuits P2 on the backlight surface of the display panel 10 to the area of the second display area 120 is less than the ratio of the vertical projection area of the multiple first pixel driving circuits P1 on the backlight surface of the first display area 110 to the area of the first display area 110.

When the reflective layer 14 is disposed in the display panel 10, the reflective layer 14 and the second pixel driving circuits P2 both prevent the structured light emitted from the structured light-emitting end 20 from being emitted out of the second display area 120. In this case, the multiple second pixel driving circuits P2 may be provided to occupy a relatively small area of the second display area 120, allowing the structured light to be transmitted through areas outside the locations of the multiple second pixel driving circuits P2, thereby ensuring the requirement of the structured light-emitting end 20 for the transmittance of the second display area 120.

Optionally, the vertical projection area of a single second pixel driving circuit on the backlight surface of the display panel 10 is less than the vertical projection area of a single first pixel driving circuit on the backlight surface of the display panel; and/or, the number of the second pixel driving circuits per unit area in the second display area is less than the number of the first pixel driving circuits per unit area in the first display area.

When the reflective layer 14 completely covers the second pixel driving circuit P2, the occupied area of a single second pixel driving circuit can be reduced. At this time, the occupied area of the reflective layer 14 can also be reduced so that the transmittance of the second display area 120 can be ensured. Alternatively, the number of the second pixel driving circuits in the second display area 120 may be reduced, that is, reducing the density of the second pixel driving circuits in the second display area, thereby reducing the occupied area of the reflective layer 14 and ensuring the transmittance of the second display area.

It is to be noted that in other embodiments, the density of the second pixel driving circuits in the second display area may be reduced while reducing the occupied area of a single second pixel driving circuit, which further ensures the transmittance of the second display area.

Figure 8:
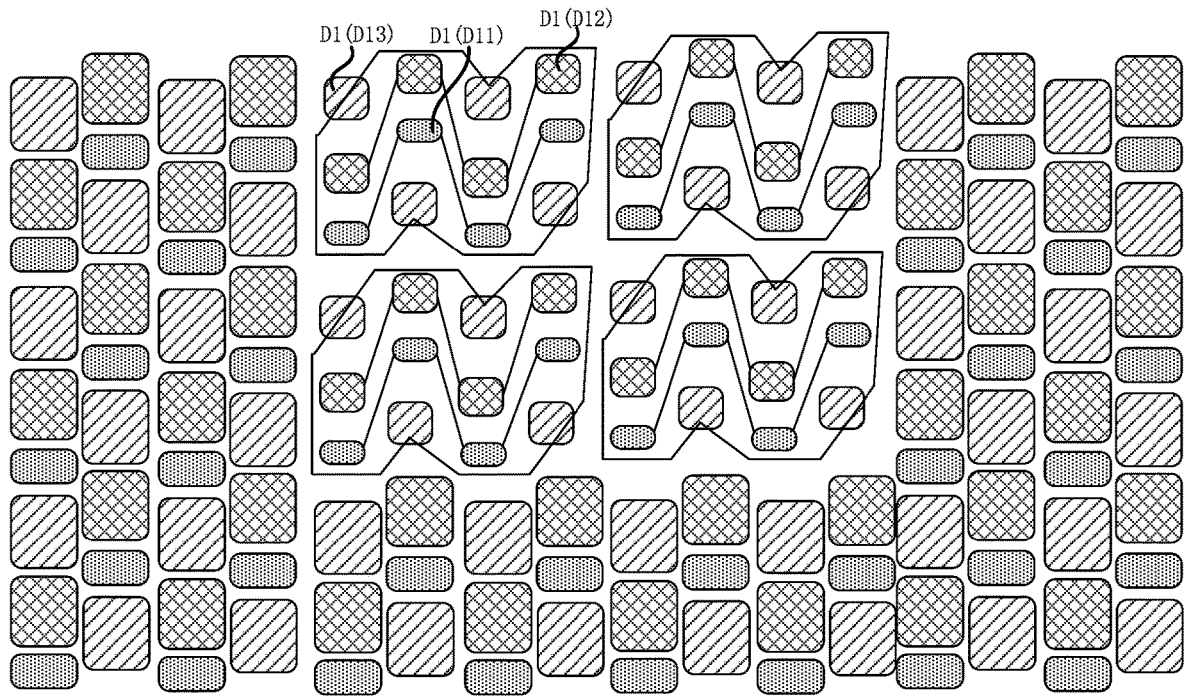
FIG. 8 is a schematic layout diagram of a first light-emitting unit according to an embodiment of the present disclosure.

As shown in FIGS. 4 and 8, the first display area 110 is provided with multiple first light-emitting units D1. At least two first light-emitting units D1 of the same emission color share one first pixel driving circuit P1.

Among the multiple first light-emitting units D1 in the first display area 110, part may emit different colors, and other part may emit the same color. For example, the multiple first light-emitting units D1 may include multiple light-emitting units D11 emitting red light, multiple light-emitting units D12 emitting green light, and multiple light-emitting units D13 emitting blue light. At least two light-emitting units of the same emission color may share one first pixel driving circuit P1, allowing one first pixel driving circuit P1 to drive at least two first light-emitting units D1. This reduces the number of the first pixel driving circuits P1, thereby reducing the influence of the first pixel driving circuits P1 on the transmittance of the first display area 110. Thus, the transmittance of the first display area 110 is ensured, the requirement of the structured light-receiving end 30 for the transmittance of the first display area 110 is met on the basis ensuring normal display of the first display area 110, and the accuracy of determining the depth information of an object by the structured light-receiving end 30 is ensured. The at least two first light-emitting units D1 of the same emission color may be disposed in different columns and/or rows. A first light-emitting unit D1 includes an anode, a light-emitting layer, and a cathode which are stacked. When the at least two first light-emitting units D1 of the same emission color share one first pixel driving circuit P1, the anodes of the at least two first light-emitting units D1 of the same emission color may be provided to be electrically connected to each other.

On the basis of the preceding technical solution, at least two second light-emitting units D2 of the same emission color in the second display area 120 share one second pixel driving circuit P2.

The second display area 120 may include multiple second light-emitting units D2 emitting different colors. For example, the multiple second light-emitting units D2 may include multiple light-emitting units emitting red light, multiple light-emitting units emitting green light, and multiple light-emitting units emitting blue light. At least two second light-emitting units D2 of the same emission color may share one second pixel driving circuit P2, allowing one second pixel driving circuit P2 to drive at least two second light-emitting units D2. This reduces the number of the second pixel driving circuits P2 in the first transition area 121, thereby reducing the required area of the first transition area 121. When the area of the second display area 120 is fixed, the area of the first transparent display area 122 can be increased, thereby further improving the amount of light emitted from the structured light-emitting end 20, and ensuring the accuracy of determining the depth information of an object by the structured light-receiving end 20. The at least two second light-emitting units D2 of the same emission color may be disposed in different columns and/or rows. A second light-emitting unit D2 includes an anode, a light-emitting layer, and a cathode which are stacked. When the at least two second light-emitting units D2 of the same emission color share one second pixel driving circuit P2, the anodes of the at least two second light-emitting units D2 of the same emission color may be provided to be electrically connected to each other.

Figure 9:
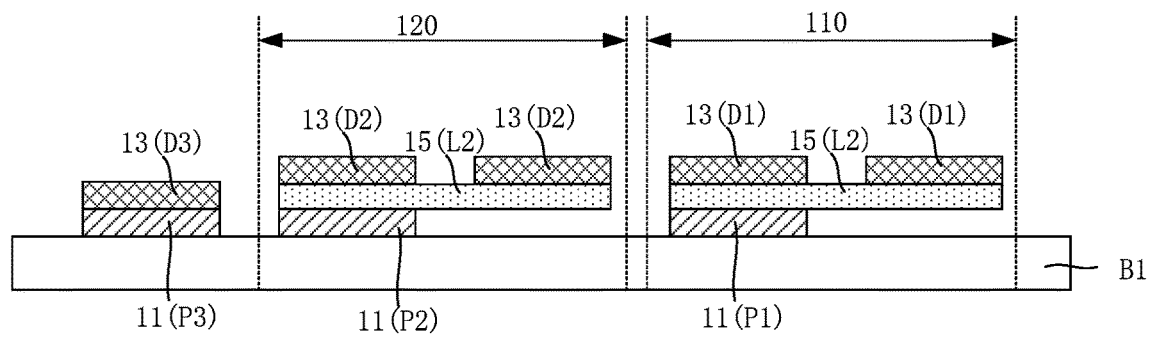
FIG. 9 is a partial sectional view of the structure of another display device according to an embodiment of the present disclosure.

As shown in FIGS. 4 and 9, the display panel 10 further includes a second transparent conductive layer 15 and a light-emitting unit layer 13. Along the thickness direction of the display panel 10, the second transparent conductive layer 15 is disposed adjacent to the light-emitting unit layer 13, and is located at the side of the light-emitting unit layer 13 facing the backlight surface of the display panel 10. The multiple first light-emitting units D1 and the multiple second light-emitting units D2 are disposed in the light-emitting unit layer 13. The second transparent conductive layer 15 includes multiple second transparent conductive lines L2. The anodes of the at least two first light-emitting units D1 of the same emission color are connected to each other through one second transparent conductive line L2, and/or the anodes of the at least two second light-emitting units D2 of the same emission color are connected to each other through one second transparent conductive line L2.

The light-emitting unit layer 13 may include the anode layer, the light-emitting layer, and the cathode layer which are stacked to form multiple light-emitting units. The anode layer is disposed on the side of the light-emitting layer facing the pixel driving circuit layer 11. The second transparent conductive layer 15 has a relatively high transmittance. For example, a material of the second transparent conductive layer 15 may be indium tin oxide. Multiple second transparent conductive lines L2 are formed in the second transparent conductive layer 15. When at least two first light-emitting units D1 of the same emission color are electrically connected to each other, each second transparent conductive line L2 is used for connecting at least two first light-emitting units D1 of the same emission color, which ensures the transmittance of the first display area 110 on the basis of achieving the one-to-multiple driving capability of the first pixel driving circuit P1. Similarly, when at least two second light-emitting units D2 of the same emission color are electrically connected to each other, the at least two second light-emitting units of the same emission color may be connected through a second transparent conductive line L2, ensuring the transmittance of the second display area 120 on the basis of achieving the one-to-multiple driving capability of the second pixel driving circuit P2. With continued reference to FIG. 9, the second transparent conductive layer 15 may be provided to be in contact with the anode layer in the light-emitting unit layer 13. Multiple second transparent conductive lines L2 are form in the second transparent conductive layer 15 so that the anodes of the at least two first light-emitting units D1 of the same emission color and/or the anodes of the at least two second light-emitting units D2 of the same emission color can be directly connected to each other.

Figure 10:
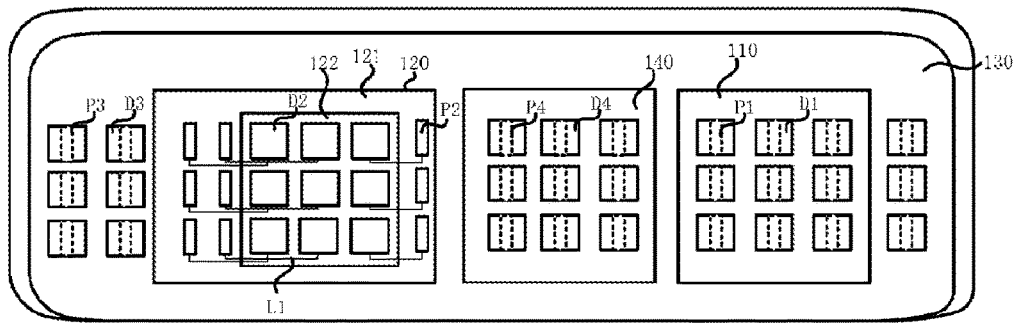
FIG. 10 is a partial top view of the structure of another display device according to an embodiment of the present disclosure.
Figure 11:
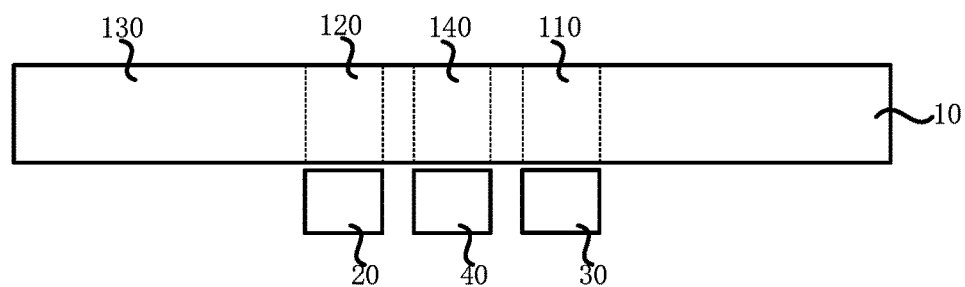
FIG. 11 is a sectional view of another display device according to an embodiment of the present disclosure.

As shown in FIGS. 10 and 11, the display device further includes a photosensor 40. The display panel 10 also includes a fourth display area 140. The third display area 130 at least partially surrounds the fourth display area 140. The photosensor 40 is disposed on the backlight surface of the display panel 10 and is disposed opposite to the fourth display area 140. The fourth display area 140 is provided with multiple fourth pixel driving circuits P4 and multiple fourth light-emitting units D4. Each fourth pixel driving circuit P4 is connected to at least one fourth light-emitting unit D4. The vertical projection of the each fourth pixel driving circuit P4 on the backlight surface of the display panel 10 overlaps the vertical projection of one fourth light-emitting unit D4, which is connected to the each fourth pixel driving circuit P4, on the backlight surface of the display panel 10. The transmittance of the fourth display area 140 is greater than the transmittance of the third display area 130.

The photosensor 40 is provided to acquire planar information of an object at the time of shooting by the display device. For example, the photosensor 40 may be a camera. The transmittance of the fourth display area 140 is greater than the transmittance of the third display area 130 so that the required amount of light for the photosensor 40 is ensured, thus the photosensor 40 can acquire accurate planar information of an object at the time of shooting. The fourth display area 140 may be provided to be in juxtaposition with the first display area 110 and the second display area 120. In the fourth display area 140, each fourth pixel driving circuit P4 is connected to at least one fourth light-emitting unit D4, and each fourth pixel driving circuit P4 can provide a driving signal for the at least one fourth light-emitting unit D4 connected to the each fourth pixel driving circuit P4 to drive the at least one fourth light-emitting unit D4 to emit light. Additionally, the vertical projection of each fourth pixel driving circuit P4 on the backlight surface of the display panel 10 may be provided to overlap the vertical projection of one fourth light-emitting unit P4, which is connected to the each fourth pixel driving circuit P4, on the backlight surface of the display panel 10, that is, along the thickness direction of the display panel 10, each fourth pixel driving circuit P4 is stacked with one fourth light-emitting unit D4, achieving the built-in of the fourth pixel driver circuit P4.

It is to be noted that in the fourth display area 140, the pixel density (i.e., pitch per inch, PPI) of the fourth display area 140 can be reduced so that the PPI of the fourth display area 140 is less than the PPI of the third display area 130, so as to ensure the transmittance of the fourth display area 140 and meet the required amount of light of the photosensor 40.

Optionally, at least two fourth light-emitting units D4 of the same emission color share one fourth pixel driving circuit P4.

The fourth light-emitting units D4 may include multiple light-emitting units emitting different colors. For example, the fourth light-emitting units D4 may include multiple light-emitting units emitting red light, multiple light-emitting units emitting green light, and multiple light-emitting units emitting blue light. When there are multiple fourth light-emitting units D4, at least two fourth light-emitting units D4 of the same emission color may be provided to share one fourth pixel driving circuit P4, allowing one fourth pixel driving circuit P4 to drive at least two fourth light-emitting units D4. This reduces the number of the fourth pixel driving circuits P4, thereby reducing the influence of metal structures in the fourth pixel driving circuits P4 on the transmittance of the fourth display area 14. Thus, the transmittance of the fourth display area 140 is ensured, and the required amount of light of the photosensor 40 is met on the basis of ensuring normal display of the fourth display area 140. Additionally, a fourth light-emitting unit D4 may also include an anode, a light-emitting layer, and a cathode which are stacked. When at least two fourth light-emitting units D4 of the same emission color share one fourth pixel driving circuit P4, the anodes of the at least two fourth light-emitting units D4 of the same emission color may be provided to be electrically connected to each other.

Figure 12:
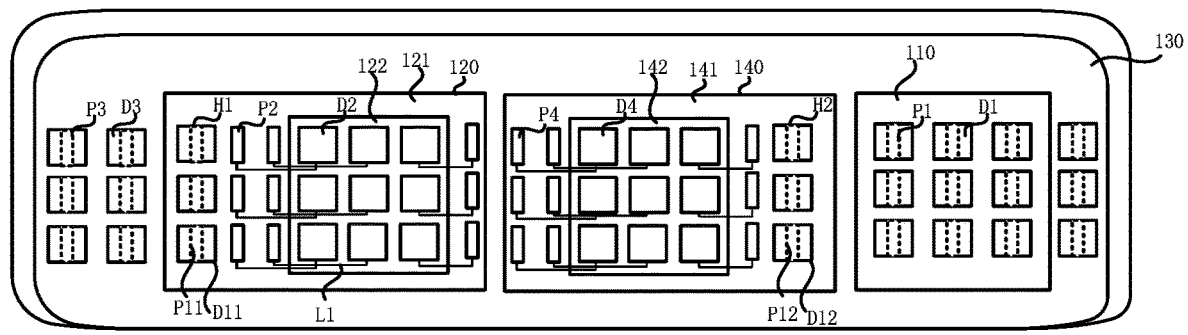
FIG. 12 is a partial top view of the structure of another display device according to an embodiment of the present disclosure.

As shown in FIG. 12, the fourth display area 140 includes a second transition area 141 and a second transparent display area 142. The second transition area 141 at least partially surrounds the second transparent display area 142. The second transition area 141 is provided with multiple fourth pixel driving circuits P4, and the second transparent display area 142 is provided with multiple fourth light-emitting units D4. Each fourth pixel driving circuit P4 is connected to at least one fourth light-emitting unit D4, and the transmittance of the second transparent display area 142 is greater than the transmittance of the third display area 130.

In FIG. 12 differing from FIG. 10, the second transition area 141 in the fourth display area 140 is provided with multiple fourth pixel driving circuits P4, and the second transparent display area 142 is provided with multiple fourth light-emitting units D4, achieving bypass placement of the fourth pixel driving circuits P4. Each fourth pixel driving circuit P4 is connected to at least one fourth light-emitting unit D4 so that the each fourth pixel driving circuit P4 is configured to provide a driving signal for the at least one fourth light-emitting unit D4 connected to the each fourth pixel driving circuit P4 to drive the at least one fourth light-emitting unit D4 to emit light. When the fourth pixel driving circuits P4 are disposed in a bypass manner relative to the fourth light-emitting units D4, it can be avoided that the fourth pixel driving circuits P4 are disposed in the second transparent display area 142, thereby reducing the influence of metal structures in the fourth pixel driving circuits P4 on the transmittance of the second transparent display area 142 and ensuring the transmittance of the second transparent display area 142. Further, the required amount of light of the photosensor 40 can be met on the basis of ensuring normal display of the second transparent display area 142.

Similarly, at least two fourth light-emitting units D4 of the same emission color share one fourth pixel driving circuit P4 so that the number of fourth pixel driving circuits P4 is reduced, thereby reducing the area of the second transition area 141. When the area of the fourth display area 140 is fixed, the area of the second transparent display area 142 can be increased so that the amount of light transmitted through the second transparent display area 142 is ensured, and the required amount of light of the photosensor is met.

As shown in FIG. 12, the second transition area 141 may also be provided with pixel units H2. A pixel unit H2 includes a pixel driving circuit P12 and a light-emitting unit D12. The pixel driving circuit P12 is connected to the light-emitting unit D12. The pixel driving circuit P12 is configured to provide a driving signal for the light-emitting unit D12 to drive the light-emitting unit D12 to emit light, achieving the display of the second transition area 141.

What is claimed is:

1. A display device, comprising:
    a display panel, wherein the display panel comprises a first display area, a second display area, a third display area, and a fourth display area, the third display area at least partially surrounds the first display area and the second display area, the fourth display area comprises a second transition area and a second transparent display area, the second transition area at least partially surrounds the second transparent display area, and a transmittance of the first display area and a transmittance of the second display area are greater than a transmittance of the third display area;
    a structured light-emitting end, wherein the structured light-emitting end is disposed on a backlight surface of the display panel, and the structured light-emitting end is disposed opposite to the second display area; and
    a structured light-receiving end, wherein the structured light-receiving end is disposed on the backlight surface of the display panel, and the structured light-receiving end is disposed opposite to the first display area; and
    wherein the first display area is provided with a plurality of first pixel driving circuits and a plurality of first light-emitting units, the plurality of first pixel driving circuits are connected to the plurality of first light-emitting units, and a vertical projection of each of the plurality of first pixel driving circuits on the backlight surface of the display panel overlaps a vertical projection of one of the plurality of first light-emitting units on the backlight surface of the display panel, the one of the plurality of first light-emitting units being connected to the each of the plurality of first pixel driving circuits; and
    wherein the second display area is provided with a plurality of second pixel driving circuits and a plurality of second light-emitting units, the plurality of second pixel driving circuits are connected to the plurality of second light-emitting units, and a light intensity of structured light emitted from the structured light-emitting end to the plurality of second pixel driving circuits is less than a light intensity of the structured light emitted into the second display area.

2. The display device according to claim 1, wherein the second display area comprises a first transition area and a first transparent display area, wherein the first transition area at least partially surrounds the first transparent display area, the plurality of second pixel driving circuits are disposed in the first transition area, the plurality of second light-emitting units are disposed in the first transparent display area, and the structured light-emitting end is disposed opposite to the first transparent display area.

3. The display device according to claim 2, wherein the display panel further comprises a pixel driving circuit layer, a first transparent conductive layer, and a light-emitting unit layer which are stacked; along a thickness direction of the display panel, the pixel driving circuit layer is disposed on a side of the light-emitting unit layer facing the backlight surface of the display panel; the plurality of first pixel driving circuits and the plurality of second pixel driving circuits are disposed in the pixel driving circuit layer; the plurality of first light-emitting units and the plurality of second light-emitting units are disposed in the light-emitting unit layer; the first transparent conductive layer comprises a plurality of first transparent conductive lines; and the plurality of second pixel driving circuits are connected to the plurality of second light-emitting units through the plurality of first transparent conductive lines.

4. The display device according to claim 1, wherein the display panel further comprises a reflective layer; along a thickness direction of the display panel, the reflective layer is disposed between the structured light-emitting end and each of the plurality of second pixel driving circuits; each of the plurality of second pixel driving circuits comprises a driving transistor and a threshold compensation transistor; and a vertical projection of the reflective layer on the backlight surface of the display panel covers vertical projections of the driving transistor and the threshold compensation transistor on the backlight surface of the display panel.

5. The display device according to claim 4, wherein the each of the plurality of second pixel driving circuits further comprises a switch transistor and a storage capacitor, and the vertical projection of the reflective layer on the backlight surface of the display panel covers vertical projections of the switch transistor and the storage capacitor on the backlight surface of the display panel.

6. The display device according to claim 4, wherein a ratio of a vertical projection area of the plurality of second pixel driving circuits on the backlight surface of the display panel to an area of the second display area is less than a ratio of a vertical projection area of the plurality of first pixel driving circuits on the backlight surface of the first display area to an area of the first display area.

7. The display device according to claim 6, wherein a vertical projection area of a single one of the plurality of second pixel driving circuits on the backlight surface of the display panel is less than a vertical projection area of a single one of the plurality of first pixel driving circuits on the backlight surface of the display panel.

8. The display device according to claim 1, wherein at least two of the plurality of first light-emitting units of a same emission color share one of the plurality of first pixel driving circuits and at least two of the plurality of second light-emitting units of a same emission color share one of the plurality of second pixel driving circuits.

9. The display device according to claim 8, wherein the display panel further comprises a second transparent conductive layer and a light-emitting unit layer; along a thickness direction of the display panel, the second transparent conductive layer is disposed adjacent to the light-emitting unit layer and is located on a side of the light-emitting unit layer facing the backlight surface of the display panel; the plurality of first light-emitting units and the plurality of second light-emitting units are disposed in the light-emitting unit layer; and the second transparent conductive layer comprises a plurality of second transparent conductive lines; and
    wherein anodes of the at least two of the plurality of first light-emitting units of the same emission color are connected to each other through one of the plurality of second transparent conductive lines; or anodes of the at least two of the plurality of second light-emitting units of the same emission color are connected through one of the plurality of second transparent conductive lines; or anodes of the at least two of the plurality of first light-emitting units of the same emission color are connected through one of the plurality of second transparent conductive lines, and anodes of the at least two of the plurality of second light-emitting units of the same emission color are connected through one of the plurality of second transparent conductive lines.

10. The display device according to claim 1, further comprising:
   a photosensor, wherein the photosensor is disposed on the backlight surface of the display panel opposite to the fourth display area; and
   the fourth display area comprises a second transition area and a second transparent display area, the second transition area at least partially surrounds the second transparent display area, the second transition area is provided with a plurality of fourth pixel driving circuits, the second transparent display area is provided with a plurality of fourth light-emitting units, each of the plurality of fourth pixel driving circuits is connected to at least one of the plurality of fourth light-emitting units, and a transmittance of the second transparent display area is greater than a transmittance of the third display area.

11. The display device according to claim 10, wherein at least two of the plurality of fourth light-emitting units of a same emission color share one of the plurality of fourth pixel driving circuits.

12. The display device according to claim 10, wherein a pixel density of the fourth display area is less than a pitch per inch of the third display area.

13. The display device according to claim 10, wherein in a case where the fourth display area comprises the second transition area and the second transparent display area, the second transition area is provided with pixel units, each of the pixel units comprises a pixel driving circuit and a light-emitting unit connected to each other.

14. The display device according to claim 2, wherein the first transition area is provided with pixel units, each of the pixel units comprises a pixel driving circuit and a light-emitting unit connected to each other.

15. The display device according to claim 4, wherein an area of the reflective layer is greater than an area of the driving transistor and the threshold compensation transistor.

16. The display device according to claim 3, wherein an insulating layer is disposed between the first transparent conductive layer and the pixel driving circuit layer, the insulating layer is provided with a through hole, and the first transparent conductive layer is connected to the plurality of second pixel driving circuits in the pixel driving circuit layer through the through hole.

17. The display device according to claim 3, wherein the third display area comprises third pixel driving circuits and third light-emitting units, the third pixel driving circuits are connected to the third light-emitting units, the third pixel driving circuits are disposed in the pixel driving circuit layer, and the third light-emitting units are disposed in the light-emitting unit layer.

18. The display device of claim 1, wherein the structured light-emitting end in use is configured to emit infrared light, and the structured light-receiving end in use is configured to receive the infrared light so that depth information is collected at a time of shooting.

19. The display device according to claim 6, wherein a number of the second pixel driving circuits per unit area in the second display area is less than a number of the first pixel driving circuits per unit area in the first display area.

20. The display device according to claim 6, wherein the vertical projection area of the single one of the plurality of second pixel driving circuits on the backlight surface of the display panel is less than the vertical projection area of the single one of the plurality of first pixel driving circuits on the backlight surface of the display panel and the number of the second pixel driving circuits per unit area in the second display area is less than the number of the first pixel driving circuits per unit area in the first display area.

* * * * *